US010875877B2

(12) United States Patent
Ketola et al.

(10) Patent No.: US 10,875,877 B2
(45) Date of Patent: Dec. 29, 2020

(54) METHOD FOR MAKING AN ORGANOAMINOSILANE; A METHOD FOR MAKING A SILYLAMINE FROM THE ORGANOAMINOSILANE

(71) Applicant: Dow Silicones Corporation, Midland, MI (US)

(72) Inventors: Barry M. Ketola, Freeland, MI (US); Jesse A. Maddock, Midland, MI (US); Brian D. Rekken, Midland, MI (US); Michael D. Telgenhoff, Midland, MI (US); Xiaobing Zhou, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 125 days.

(21) Appl. No.: 16/061,461

(22) PCT Filed: Dec. 16, 2016

(86) PCT No.: PCT/US2016/067152
§ 371 (c)(1),
(2) Date: Jun. 12, 2018

(87) PCT Pub. No.: WO2017/106632
PCT Pub. Date: Jun. 22, 2017

(65) Prior Publication Data
US 2019/0352315 A1    Nov. 21, 2019

Related U.S. Application Data

(60) Provisional application No. 62/269,286, filed on Dec. 18, 2015.

(51) Int. Cl.
| | | |
|---|---|---|
| *C07F 7/02* | (2006.01) | |
| *C07F 7/10* | (2006.01) | |
| *C07F 7/20* | (2006.01) | |
| *B01J 31/14* | (2006.01) | |
| *C01B 21/087* | (2006.01) | |
| *C01B 33/027* | (2006.01) | |
| *C08G 77/62* | (2006.01) | |
| *C23C 16/455* | (2006.01) | |
| *H01L 21/02* | (2006.01) | |
| *C07F 7/08* | (2006.01) | |
| *C23C 16/34* | (2006.01) | |

(52) U.S. Cl.
CPC .............. *C07F 7/10* (2013.01); *B01J 31/146* (2013.01); *C01B 21/087* (2013.01); *C01B 33/027* (2013.01); *C07F 7/025* (2013.01); *C07F 7/0803* (2013.01); *C07F 7/20* (2013.01); *C08G 77/62* (2013.01); *C23C 16/345* (2013.01); *C23C 16/45553* (2013.01); *H01L 21/02208* (2013.01); *B01J 2231/005* (2013.01); *B01J 2531/002* (2013.01)

(58) Field of Classification Search
CPC .......... C07F 7/025; C07F 7/10; C07F 7/0803; C07F 7/20; B01J 31/146; B01J 2231/005; B01J 2531/002; C01B 21/087; C01B 33/027; C08G 77/62; C23C 16/345; C23C 16/45553; H01L 21/02208
See application file for complete search history.

(56) References Cited

U.S. PATENT DOCUMENTS

| | | | | |
|---|---|---|---|---|
| 6,391,803 B1 * | 5/2002 | Kim | ........................ | C07F 7/025 |
| 8,461,367 B2 * | 6/2013 | Hamada | ................ | C01B 21/087 |
| | | | | 556/412 |
| 8,771,807 B2 * | 7/2014 | Xiao | ................. | C23C 16/45553 |
| | | | | 427/578 |
| 8,912,353 B2 * | 12/2014 | Xiao | ..................... | C23C 16/401 |
| | | | | 556/410 |
| 9,233,990 B2 * | 1/2016 | Xiao | ........................ | C07F 7/10 |
| 9,284,198 B2 | 3/2016 | Agarwal et al. | | |
| 9,758,534 B2 * | 9/2017 | Xiao | ....................... | C07F 7/025 |
| 9,777,025 B2 * | 10/2017 | Girard | ............... | C23C 16/45553 |
| 9,920,078 B2 * | 3/2018 | Sanchez | .................. | C07F 7/025 |

(Continued)

FOREIGN PATENT DOCUMENTS

| | | | | |
|---|---|---|---|---|
| EP | 2818474 A1 * | 12/2014 | .......... | C23C 16/345 |
| JP | 03063284 A | 3/1991 | | |

(Continued)

OTHER PUBLICATIONS

Melen, Chem. Commun., 2014, 50, 1161-1174 (Year: 2014).*

(Continued)

*Primary Examiner* — Alexander R Pagano
(74) *Attorney, Agent, or Firm* — S. Matthew Cairns

(57) ABSTRACT

A method of making an organoaminosilane compound, comprising i) combining A) a compound comprising a primary or secondary amine, B) monosilane ($SiH_4$), and C) a catalyst, where the catalyst comprises magnesium or boron, where A), B) and C) are combined under sufficient conditions to form the organoaminosilane compound and hydrogen. A method of making a silylamine, the method comprising: i) forming an organoaminosilane compound by i) combining A) a compound comprising a primary or secondary amine, B) monosilane ($SiH_4$), and C) a catalyst, where the catalyst comprises magnesium or boron, and ii) combining ammonia and the organoaminosilane compound produced in i) under sufficient conditions to form a silylamine product and a byproduct, where the byproduct is a primary or secondary amine.

20 Claims, No Drawings

(56) References Cited

U.S. PATENT DOCUMENTS

| | | | |
|---|---|---|---|
| 10,030,038 B2 | 7/2018 | Rekken et al. | |
| 10,294,250 B2 | 5/2019 | Xiao et al. | |
| 10,494,387 B2 | 12/2019 | Sanchez et al. | |
| 10,647,578 B2 * | 5/2020 | Sanchez | B05D 1/18 |
| 2011/0189227 A1 | 8/2011 | Song et al. | |
| 2012/0021127 A1 * | 1/2012 | Sato | H01L 21/02222 |
| | | | 427/248.1 |
| 2016/0046493 A1 * | 2/2016 | Lang | B01J 19/088 |
| | | | 423/347 |
| 2018/0127592 A1 * | 5/2018 | Lei | C23C 16/402 |
| 2018/0258107 A1 * | 9/2018 | Zhou | C07F 7/025 |
| 2019/0085452 A1 * | 3/2019 | Lei | C23C 16/345 |
| 2020/0262849 A1 * | 8/2020 | Ketola | C08G 77/62 |

FOREIGN PATENT DOCUMENTS

| | | |
|---|---|---|
| KR | 2013075183 A | 7/2013 |
| WO | 2015-048237 | 4/2015 |

OTHER PUBLICATIONS

Hill et al., Chem. Sci., 2013, 4, 4212-4222 (Year: 2013).*
D. Liptrot et al., 54 Angew. Chem. Int. Ed., 15280-15283 (2015) (Year: 2015).*
B. Aylett et al., J. Chem. Soc. (A), 1918-1921 (1967) (Year: 1967).*
Taiwan search report for Application No. 105141899 dated Aug. 6, 2020.

* cited by examiner

METHOD FOR MAKING AN ORGANOAMINOSILANE; A METHOD FOR MAKING A SILYLAMINE FROM THE ORGANOAMINOSILANE

CROSS REFERENCE TO RELATED APPLICATIONS

This application is a U.S. national stage filing under 35 U.S.C. § 371 of PCT Application No. PCT/US16/067152 filed on 16 Dec. 2016, currently pending, which claims the benefit of U.S. Provisional Patent Application No. 62/269,286 filed 18 Dec. 2015 under 35 U.S.C. § 119 (e). PCT Application No. PCT/US16/067152 and U.S. Provisional Patent Application No. 62/269,286 are hereby incorporated by reference.

FIELD OF THE INVENTION

The present invention relates, generally, to a method of making organoaminosilane compounds comprising combining a primary or secondary amine, monosilane ($SiH_4$), and a magnesium or boron catalyst to form an organoaminosilane. The present invention further relates to a method of forming a silylamine comprising combining the organoaminosilane with ammonia to produce the silylamine.

BACKGROUND OF THE INVENTION

Organoaminosilanes have been prepared by the reaction of an alkylamine with trihalosilane to produce an alkylaminohalosilane followed by the reduction of the alkylaminohalosilane produced with lithium aluminum hydride to form the organoaminosilane. The organoaminosilane produced by this method comprises residual halogen, which can cause issues in industrial processes and application using the resulting organoaminosilane. The halogen impurities cannot be removed sufficiently for some applications, and the processes to reduce the halogen content increase production costs. Production of organoaminosilanes by direct reaction of a primary or secondary amine with monosilane is inefficient with the reaction not proceeding to an appreciable extent.

Trisilylamine (TSA) has industrial applications including use as a precursor for the deposition of silicon-containing films in photovoltaic and electronic applications. A significant industrial process for making TSA comprises the reaction of monochloroosilane with ammonia. In addition to TSA, this process produces chlorine-containing byproducts such as ammonium chloride. These byproducts are unwanted in the end-use applications for TSA. For example, halogen is detrimental in the process of forming silicon-containing films in chemical vapor deposition processes using TSA. Therefore, the lowest amount of halogen possible is desired in these applications.

TSA has also been produced through the reaction of disilylamine and removal of ammonia as a byproduct. However, halogen may also present in TSA produced from the reaction of disilylamine because halogen can be introduced in the process with the disilylamine.

Therefore, a need exists for organoaminosilanes comprising low halogen content, new methods for making organoaminosilanes comprising low halogen content, for silylamine compositions comprising low halogen content, and for new processes to produce silylamines (i.e., TSA) comprising low halogen content.

BRIEF SUMMARY OF THE INVENTION

The present invention is directed to a method of making an organoaminosilane compound, the method comprising:
combining
A) a compound comprising a primary or secondary amine,
B) monosilane ($SiH_4$), and
C) a catalyst, where the catalyst comprises magnesium or boron,
where A), B) and C) are combined under sufficient conditions to form the organoaminosilane compound and hydrogen.

The present invention is further directed to a method of making a silylamine, the method comprising:
i) combining
A) a compound comprising a primary or secondary amine,
B) monosilane ($SiH_4$), and
C) a catalyst, where the catalyst comprises magnesium or boron,
where A), B) and C) are combined under sufficient conditions to form an organoaminosilane compound and hydrogen, and
ii) combining ammonia and the organoaminosilane compound produced in i) under sufficient conditions to form a silylamine product and a byproduct, where the byproduct is a primary or secondary amine.

The method of making the organoaminosilane produces organoaminosilanes having low or no halogen content, economically and in good yield. The method of making silylamine produces silylamines having low or no halogen content, economically and in good yield.

The organoaminosilane produced by the method may be used as additives in the production of elastomers, and as a reactant to make other silicon-containing materials such as silylamines. The silylamines produced by the method of the invention may be used in chemical vapor deposition processes to make silicon-containing films.

DETAILED DESCRIPTION OF THE INVENTION

As used herein, ppmw is the abbreviation for parts per million (w/w).

As used herein, "no detectable amount" means that no amount of halogen can be detected in the composition using methods known at the time of filing.

As used herein, "precatalyst" means a compound that when combined with a mixture of other compounds reacts with one of the other compounds to form a catalyst for another, separate reaction in the mixture.

A method of making an organoaminosilane compound, the method comprising:
combining
A) a compound comprising a primary or secondary amine,
B) monosilane ($SiH_4$), and
C) a catalyst, where the catalyst comprises magnesium or boron,
where A), B) and C) are combined under sufficient conditions to form the organoaminosilane compound and hydrogen.

The compound comprising primary or secondary amine A) may be any compound including polymeric and non-polymeric compounds, alternatively non-polymeric compounds comprising a primary or secondary amine, alternatively, the compound comprising a primary or secondary amine is according to formula (III)

$$R^1N(R^2)_aH_{2-a} \tag{III}$$

where $R^1$ is an organic polymer, $C_{1-20}$ hydrocarbyl, or —$SiR^3{}_3$, where each $R^3$ independently is $C_{1-6}$ hydrocarbyl, each $R^2$ independently is $C_{1-20}$ hydrocarbyl, H, —$SiH_3$, or $SiR^3{}_3$, where $R^3$ is as defined above, and subscript a is 0 or 1, alternatively 1, alternatively 0.

The organic polymers represented by $R^1$ may be, but are not limited to, polyalkylene, polyester, polyurethane, polyacrylate, and polysiloxane, and may have a linear, branched, star, or any other structure known in the art for organic polymers. The organic polymers may be made by methods known in the art. The organoaminosilane functionality can be included in the polymer by copolymerization with a monomer with the organoaminosilane functionality. For example, an organoaminosilane comprising vinyl or allylic functionality can be copolymerized with other organic monomers including, but not limited to, other organic vinyl, ester, or acrylic monomers. Alternatively, the organoaminosilane functionality may be grafted onto the polymer through reaction of an organoaminosilane having a functional group which reacts with a group on the backbone of a polymer. For example, an organoaminosilane having Si—H my react with an unsaturated group of the polymer in a hydrosilation reaction. One skilled in the art would understand how to make polymers with organoaminosilane functionality. Organic polymers comprising organoaminosilane functionality are available commercially.

The hydrocarbyl groups represented by $R^1$ typically have from 1 to 20, alternatively from 1 to 12, alternatively from 1 to 6, alternatively from 1 to 4, alternatively from 2 to 4, alternatively 3, carbon atoms. Acyclic hydrocarbyl groups having at least 3 carbon atoms can have a linear or branched structure. Examples of hydrocarbyl groups represented by $R^1$ include, but are not limited to, alkyl, such as methyl, ethyl, propyl, isopropyl, butyl, 1-methylpropyl, 2-methylpropyl, 1,1-dimethylethyl, pentyl, 1-methylbutyl, 1-ethylpropyl, 2-methylbutyl, 3-methylbutyl, 1,2-dimethylpropyl, hexyl, heptyl, octyl, nonyl, decyl, undecyl, dodecyl, pentadecyl, hexadecyl, icosyl; cycloalkyl, such as cyclopentyl, cyclohexyl, and methylcyclohexyl; aryl, such as phenyl and naphthyl; alkaryl such as tolyl and xylyl, aralkyl, such as benzyl and penethyl; alkenyl, such as vinyl, allyl, propenyl, butenyl, hexenyl, and octenyl; arylalkenyl, such as styryl and cinnamyl, and alkynyl, such as ethynyl and proynyl.

The hydrocarbyl groups represented by $R^2$ are as described for $R^1$. In one embodiment, $R^1=R^2=$a branched alkyl having 3 to 6 carbon atoms, alternatively isopropyl.

The hydrocarbyl groups represented by $R^3$ typically have from 1 to 6, alternatively from 1 to 3, alternatively from 1 to 3, alternatively 1, alternatively 2, alternatively 3, carbon atoms. Acyclic hydrocarbyl groups having at least 3 carbon atoms can have a linear or branched structure. Examples of hydrocarbyl groups represented by $R^1$ include, but are not limited to, those defined above for $R^1$ and having from 1 to 6 carbon atoms.

The groups represented by $R^1$ and $R^2$ may be the same or different. In one embodiment, $R^1$ and $R^2$ are not both phenyl. If $R^1$ and $R^2$ are both phenyl, in some embodiments the melting point of the compound comprising a primary or secondary amine and the organoaminosilane produced are above room temperature. This melting point creates material handling issues in production. For example, issues such as column clogging, poor or difficult separation of products and byproducts, and safety due to elevated temperature requirements can be confronted.

In one embodiment, the compound comprising a primary or secondary amine according to formula (III) is an organic polymer comprising one or more groups according to formula (II)

$$—N(R^2)_a(H)_b(SiH_3)_{2-a-b} \tag{II}$$

where each $R^2$ independently is as defined above, subscript a is 0 or 1, alternatively 0, alternatively 1, subscript b is 1 or 2, alternatively 1, alternatively 2, the sum a+b<3, and where the groups according to formula (II) are in pendant, terminal, or pendant and terminal positions on the organic polymer.

Examples of the primary and secondary amine include, but are not limited to, methylamine, ethylamine, ispropylamine, propylamine, 1-methylpropylamine, pentylamine, 1-methylbutylamine, hexylamine, pheylamine, cyclohexylamine, heptylamine, octylamine, nonylamine, decylamine, undecylamine, decylamine, pentadecylamine, octadecylamine, cosylamine, dimethylamine, diethylamine, diispropylamine, dipropylamine, di-1-methylpropylamine, dipentylamine, di-1-methylbutylamine, dihexylamine, dicyclohexylamine, diheptylamine, dioctylamine, dinonylamine, didecylamine, diundecylamine, dodecylamine, dipentadecylamine, dioctadecylamine, dicosylamine, methylethylamine, methylpropylamine, methylisopropylamine, methylbutylamine, 1-methylpropylmethylamine, methylphenylamine, methylcyclohexylamine, methylocytlyamine, 1-methylheptylmethylamine, ethylethylamine, ethylpropylamine, ethylisopropylamine, ethylbutylamine, 1-methylpropylethylamine, ethylphenylamine, ethylcyclohexylamine, ethylocytlyamine, 1-methylheptylethylamine, propylbutylamine, isopropylbutylamine, propylisobutylamine, isopropylisobutylamine, propylpentylamine, isopropylpentylamine, propylphenylamine, isopropylphenylamine, isopropylcyclohexylamine, propyloctylamine, propyldodecylamine, and a polymer such as a polyacrylate, polyalkylene, or polyester having a pendant group according to formula (II) above. One skilled in the art would know how to make the primary or secondary amine. Many of these compounds are available commercially.

The monosilane B) is $SiH_4$. One skilled in the art would know how to produce monosilane.

The catalyst C) comprises magnesium or boron. The boron catalyst is according to the formula $BR^4{}_3$, where each $R^4$ independently is a $C_{1-10}$ substituted or unsubstituted hydrocarbyl, alternatively $C_{4-8}$ substituted or unsubstituted hydrocarbyl, alternatively six carbon substituted or unsubstituted hydrocarbyl, alternatively substituted phenyl. The substituents comprising the substitution on the hydrocarbyl groups $R^4$ include halogen, alternatively F, Cl, or Br, alternatively F of Cl, alternatively F.

Examples of the catalyst comprising boron include, but are not limited to, trimethylborane, triethylborane, triphenylborane and tris(pentafluorophenyl)borane. In one embodiment, the catalysts is tris(pentafluorophenyl)borane. One skilled in the art would know how to make the catalyst comprising boron. Some of these catalysts are available commercially.

The catalyst comprising magnesium is bis(dihydrocarbylamino) magnesium represented by the formula $(R^5{}_2N)_2Mg$, wherein each $R^5$ independently is a hydrocarbyl group having from 1 to 20 carbon atoms, alternatively from 1 to 12, alternatively from 1 to 6, alternatively from 1 to 4, alternatively from 2 to 4, alternatively 3, carbon atoms. The hydrocarbyl groups represented by $R^5$ are as described above for $R^1$ in formula (I) below. In one embodiment, the catalysts is boron tris-pentafluorobenzene.

Examples of the catalyst comprising magnesium include, but are not limited to, bis(dimethylamino) magnesium, bis (diethylamino) magnesium, bis(diisopropylamino) magnesium, bis(dipropylamino) magnesium, bis(di-1-methylpropylamino) magnesium, bis(dipentylamino) magnesium, bis (di-1-methylbutylamino) magnesium, bis(dihexylamino) magnesium, bis(dicyclohexylamino) magnesium, bis(diheptylamino) magnesium, dioctylamino) magnesium, bis(dinonylamino) magnesium, bis(didecylamino) magnesium, bis(diundecylamino) magnesium, bis(dodecylamino) magnesium, bis(dipentadecylamino) magnesium, bis(dioctadecylamino) magnesium, bis(dicosylamino) magnesium.

In one embodiment, the catalyst is combined with A) and B) by combining a pre-catalyst that forms the catalyst C) after combined. In one embodiment, the pre-catalyst is dihydrocarylmagnesium according to the formula $R^5{}_2Mg$, wherein each $R^5$ independently is as described above for the catalyst C), or a bis(dihydrocarbylamino) magnesium according to the formulas $Mg(NR^6{}_2)_2$, where each $R^6$ independently is hydrocarbyl having from 1 to 10 carbon atoms or trimethylsilyl, and the pre-catalyst is different than the catalyst.

Hydrocarbyl groups represented by $R^6$ have 1 to 10 carbon atoms, alternatively 1 to 8 carbon atoms, alternatively 1 to 6 carbon atoms. Examples of hydrocarbyl groups represented by $R^6$ are as described above for $R^1$ having the requisite number of carbon atoms. In one embodiment, the groups represented by $R^6$, include, but are not limited to, alkyl having from 1 to 6 carbon atoms such as methyl, ethyl, propyl, butyl, pentyl, hexyl, phenyl, and their isomers. In another embodiment, the groups represented by $R^6$ are trimethylsilyl.

Examples of the pre-catalyst according to the formula $R^5{}_2Mg$ include, but are not limited to, dimethylmagnesium, diethylmagnesium, diisopropylmagnesium, dipropylmagnesium, di-1-methylpropylmagnesium, dipentylmagnesium, di-1-methylbutylmagnesium, dihexylmagnesium, dicyclohexylmagnesium, diheptylmagnesium, dioctylmagnesium, dinonylaminomagnesium, didecylmagnesium, diundecylmagnesium, dodecylmagnesium, dipentadecylaminomagnesium, dioctadecylmagnesium, dicosylmagnesium. In one embodiment the $R^5$ of the precatalyst is a branch alkyl group having from 2 to 6 carbon atoms, alternatively diisopropylmagnesium, alternatively dibutylmagnesium.

Examples of pre-catalyst according to the formula $Mg(NR^6{}_2)_2$ include, but are not limited to, bis(diisopropylamino) magnesium, bis(diethylamino) magnesium, bis(diphenylamino) magnesium, bis(dioctylamino) magnesium, bis(ditrimethylsilylamino) magnesium, and those materials listed as the catalyst above.

The dihydrocarbylmagnesium may be prepared by methods know in the art. For example, the dihydrocarbylmagnesium can be prepared by adding at least one equivalent of dioxane to a solution of hydrocarbylmagnesium halide. The bis(dihydrocarbylamino) magnesium can be prepared by methods known in the art. One skilled in the art would know how to make bis(dihydrocarbylamino) magnesium.

A), B) and C) are combined in i) under sufficient conditions to form an organoaminosilane compound and hydrogen. As used herein, "sufficient conditions" means at a temperature and pressure and for a time to causes the reaction to proceed, alternatively a temperature from 0 to 300° C., alternatively from 20 to 200° C., alternatively from 75 to 125° C., at a pressure from sub-atmospheric to super-atmospheric, alternatively from sub-atmospheric to 3500 kPag, alternatively from 0 kPag to 3500 kPag, alternatively from 5 kPag to 2100 kPag, alternatively from 250 to 1800 kPag, and a time from 1 minute to 2 days, alternatively from 1 hr to 8 hrs.

A), B), and C) may be combined in any order in i). In one embodiment, A) and C) are combined before B) is combined, alternatively B) and C) are combined before A) is combined with B) and C), alternatively A) and B) are combined then C).

A) and B) are combined in a molar ratio of A) to B) of from 0.001 to 1000, alternatively from 0.01 to 100, alternatively from 0.1 to 10, alternatively from 0.33 to 3.

The combining of A), B), and C) may be done in an inert atmosphere or a non-inert atmosphere. For example, the reactor for the combining may be placed under vacuum prior to the contacting and/or purged with nitrogen prior to the contacting.

The combining of A), B), and C) may be conducted until the disappearance of one or more of the reactants or appearance of the organoaminosilane. The appearance and disappearance of the reactants and product may be monitored by methods known in the art such as, but not limited to, $^{29}Si$ NMR and/or $^1H$ nuclear magnetic resonance (NMR) spectroscopy.

The catalyst comprising magnesium or boron is combined in a catalytic effective amount. A catalytic effective amount of catalyst comprising magnesium or boron means an amount that will catalyze the reaction of A) and B) at the specific concentration of A) and B), alternatively an amount of catalyst that is up to 10% (w/w), alternatively from 0.0001 to 5% (w/w), alternatively from 0.01 to 2% (w/w), alternatively from 0.1 to 1% (w/w), based on the weight of A).

A), B), and C) may further be combined with D) a solvent. The solvent, D), is a liquid at the temperature and pressure conditions of the reaction. In one embodiment, D) is non-electron donating, alternately non-electron donating hydrocarbon, alternatively an alkane. The non-electron donating hydrocarbon or alkane solvent comprises from 5 to 18, alternatively from 6 to 10 carbon atoms. Electron donating solvent may be used as D) but non-electron-donating is preferred.

Examples of the solvent include alkanes, such as, but not limited to, pentane, hexane, heptane, octane, nonane, decane, undecane, dodecane pentadecane, hexadecane, isocane, and the isomers thereof. In one embodiment, the combining in i) comprises hexane, heptane, or octane.

The solvent D) may be combined in any order. Typically, the solvent D) is combined with A) and C) prior to combining with B), alternatively with C) then A) prior to combining with B).

A), B), C) and, when present, D) are combined in i) a reactor. One skilled in the art would know how to select a reactor for the combination of A), B), C) and D). For example, a pressure reactor such as a Parr reactor may be used. Alternatively a sealed tube may be used.

The organoaminosilane formed may be any organoaminosilane that can be formed from the combining of A), B), and C) described above, alternatively the organoaminosilane is according to formula (I)

$$R^1N(R^2)_a(H)c(SiH_3)_{2-a-c} \qquad (I),$$

where $R^1$, $R^2$, and subscript "a" are as described above, c is 0 or 1, alternatively c is 0, alternatively C is 1, and the sum a+c<2, provided that the organoaminosilane produced in i) has at least one more nitrogen-bonded —$SiH_3$ group than the compound comprising the primary or secondary amine.

In one embodiment, the organoaminosilane compound according to formula (I) is an organic polymer comprising one or more groups according to formula (IV)

$$—N(R^2)_a(H)_c(SiH_3)_{2-a-c} \quad \text{(IV)}$$

where $R^2$ and subscript a are as defined above, subscript c is 0 or 1, alternatively 0, alternatively 1, the sum a+c is 0 or 1, alternatively 0, alternatively 1, and the groups according to formula (IV) are in pendant, terminal, or pendant and terminal positions on the organic polymer.

Examples of the organoaminosilane compound formed include, but are not limited to, methylamino silane, ethylamino silane, ispropylamino silane, propylamino silane, 1-methylpropylamino silane, pentylamino silane, 1-methylbutylamino silane, hexylamino silane, pheylamino silane, cyclohexylamino silane, heptylamino silane, octylamino silane, nonylamino silane, decylamino silane, undecylamino silane, decylamino silane, pentadecylamino silane, octadecylamino silane, cosylamino silane, dimethylamino silane, diethylamino silane, diispropylamino silane, dipropylamino silane, di-1-methylpropylamino silane, dipentylamino silane, di-1-methylbutylamino silane, dihexylamino silane, dicyclohexylamino silane, diheptylamino silane, dioctylamino silane, dinonylamino silane, didecylamino silane, diundecylamino silane, dodecylamino silane, dipentadecylamino silane, dioctadecylamino silane, dicosylamino silane, methylethylamino silane, methylpropylamino silane, methylisopropylamino silane, methylbutylamino silane, 1-methylpropylmethylamino silane, methylphenylamino silane, methylcyclohexylamino silane, methylocytlyamino silane, 1-methylheptylmethylamino silane, ethylethylamino silane, ethylpropylamino silane, ethylisopropylamino silane, ethylbutylamino silane, 1-methylpropylethylamino silane, ethylphenylamino silane, ethylcyclohexylamino silane, ethylocytlyamino silane, 1-methylheptylethylamino silane, propylbutylamino silane, isopropylbutylamino silane, propylisobutylamino silane, isopropylisobutylamino silane, propylpentylamino silane, isopropylpentylamino silane, propylphenylamino silane, isopropylphenylamino silane, isopropylcyclohexylamino silane, propyloctylamino silane, propyldodecylaminosilane.

In one embodiment, the organoaminosilane compound comprises no halogen, alternatively, based on the weight of the organoaminosilane, less than 5 ppmw, alternatively less than 1 ppmw, alternatively less than 0.1 ppmw, of halogen. The halogen is fluourine, chlorine, bromine, or iodine, alternatively of bromine or chlorine, alternatively of chlorine. One skilled in the art would know how to measure the halogen in the organoaminosilane compound.

A), B), C) and, when present, D) are combined in i) a reactor. One skilled in the art would know how to select a reactor for the combination of A), B), C) and D). For example, a pressure reactor such as a Parr reactor may be used. Alternatively a sealed tube may be used.

The method of forming an organoaminosilane may further comprise recovering the organoaminosilane. The organoaminosilane may be recovered by methods known in the art. For example, the organoaminosilane may be recovered by distillation decantation, evaporation, extraction, filtration, freeze drying, gas chromatography, ion exchange chromatography, partitioning, phase separation, reverse phase liquid chromatography, stripping volatilization, and washing.

A method of making a silylamine, the method comprising:
i) combining
A) a compound comprising a primary or secondary amine,
B) monosilane ($SiH_4$), and
C) a catalyst, where the catalyst comprises magnesium or boron,
where A), B) and C) are combined under sufficient conditions to form an organoaminosilane compound and hydrogen, and
ii) combining ammonia and the organoaminosilane compound produced in i) under sufficient conditions to form a silylamine product and a byproduct, where the byproduct is a primary or secondary amine.

A) a compound comprising a primary or secondary amine, B) monosilane ($SiH_4$), and C) a catalyst, where the catalyst comprises magnesium or boron,
where A), B) and C) are combined under sufficient conditions to form an organoaminosilane compound and hydrogen and each of A), B), C) and the organoaminosilane compound are as described for the method of making an organoaminosilane compound above.

In one embodiment, the organoaminosilane compound produced in i) is according to formula (I) above wherein $R^1$ is alkyl and each $R^2$ is independently $R^1$ or H, alternatively wherein $R^1$ is branched alkyl having 3 to 6 carbon atoms, and each $R^2$ is independently $R^1$ or H, alternatively wherein the compound according to formula (I) is an organic polymer comprising one or more groups according to formula (II)

$$—N(R^2)_a(H)_b(SiH_3)_{2-a-b} \quad \text{(II)}$$

where each $R^2$ independently is H, $C_{1-20}$ hydrocarbyl, or $—Si(R^3)_3$, where each $R^3$ independently is $C_{1-6}$ hydrocarbyl, subscript a and b independently are 0 or 1, and a+b<2, where the groups according to formula (II) are in pendant, terminal, or pendant and terminal positions on the organic polymer.

In ii), ammonia is combined with the organoaminosilane compound produced in i) under sufficient conditions to form a silylamine product and a byproduct, where the byproduct is a primary or secondary amine.

The organoaminosilane compound is as described above in the method of making an organaminosilane compound.

The silylamine formed in ii) is any silylamine formed by the combination of the aminosilane compound produced in i) with ammonia, alternatively the silylamine is disilylamine (($SiH_3$)$_2$NH) or trisilylamine (($SiH_3$)$_3$N), alternatively trisilylamine.

The silylamine formed in ii) has less than 5 ppmw, alternatively less than 1 ppmw, alternatively less than 0.1 ppmw, based on the weight of the silylamine, of halogen, alternatively bromine or chlorine, alternatively chlorine. In one embodiment, the silylamine has no detectible amount of halogen.

The byproduct formed in ii) comprises at least a primary or secondary amine. In one embodiment, the byproduct comprises a primary or secondary amine according to formula (III) described above.

The combining in ii) of the method of forming a silylamine is conducted in a reactor. The reactor is suitable for reacting ammonia and the compound comprising aminosilane functionality. For example, the method can be conducted in a Parr reactor or a sealed tube. A chilled reactor may be used as well. One skilled in the art would understand how to select an appropriate reactor for the method.

The combining in ii) may be done in an inert atmosphere or a non-inert atmosphere. For example, the reactor for the combining may be placed under vacuum prior to the contacting and/or purged with nitrogen prior to the contacting.

The organoaminosilane compound is combined with ammonia under sufficient conditions to form a silylamine and a byproduct. The "conditions sufficient" to form a silylamine and a byproduct are a temperature and pressure to cause the reaction, alternatively at a temperature from −20 to 150° C. and a pressure form 0 to 300 kPa(g), alternatively a temperature from 0 to 50° C. and a pressure from 45 to 250 kPa(g). Generally, the required pressure increases with increasing temperature. One skilled in the art would know how to select temperature and pressure conditions to cause the reaction.

The ammonia and the organoaminosilane compound are typically combined in a mole ratio of ammonia to the organoaminosilane compound of from 0.1 to 100, alternatively from 1 to 10, alternatively 0.20 to 1, alternatively 0.25 to 1, alternatively 0.30 to 1.

The ammonia and the organoaminosilane compound functionality can be combined in any order. Typically the organoaminosilane compound is added to the reactor, which is then pressurized with ammonia.

The time for the combining can vary by temperature. Typically the combining is from a few seconds up to days, alternatively from 5 minutes to 5 hours, alternatively from 15 minutes to 2 hours.

The combining in ii) may be conducted until the disappearance of one or more of the reactants or appearance of the silylamine. The appearance and disappearance of the reactants and product may be monitored by methods known in the art such as, but not limited to, $^{29}$Si NMR and/or $^1$H nuclear magnetic resonance (NMR) spectroscopy.

The method of forming a silylamine may further comprise combining the ammonia and the organoaminosilane compound in a solvent. Examples of solvent include, but are not limited to, ether-based solvents, alkanes, aromatic solvents, and the like.

In ii) the method forms a silylamine, alternatively trisilylamine, and a byproduct. The byproduct is the amine remaining after the aminosilane functionality of the organoaminosilane compound is reacted in the method. The aminosilane functionality of the organoaminosilane compound in the method is replaced by a hydrogen atom to produce either a primary or secondary amine depending upon the starting organoaminosilane in i). In one embodiment, the byproduct is a primary or secondary amine according to formula (III) described above.

The silylamine formed by the method may be recovered. The silylamine may be recovered from the byproduct and any unreacted organoaminosilane compound by common separation techniques such as distillation decantation, evaporation, extraction, filtration, freeze drying, gas chromatography, ion exchange chromatography, partitioning, phase separation, reverse phase liquid chromatography, stripping volatilization, and washing. One skilled in the art would know how to recover the silylamine.

The method of forming a silylamine may further comprise recovering the primary or secondary amine byproduct from ii).

The method of forming a silylamine may further comprise combining the primary or secondary amine byproduct from ii) in i) as A) the compound comprising a primary or secondary amine.

Organoaminosilanes have a variety of industrial uses such as, but not limited to filler treatments, rubber additives, precursors to make other silane materials. Silylamines as made according to the invention may be used in processes of forming silicon-containing films in chemical vapor deposition processes such as atomic layer deposition and plasma enhanced atomic layer deposition. The invention may have other advantages and uses, some of which may be described later.

Any reference to "invention" or an equivalent expression (e.g., the present invention, this invention or the invention) shall mean those representative inventive embodiments or aspects, and shall not be used to unduly limit inventive scope. Any reference to a Markush group may be equivalently expressed in different ways. E.g., a Markush group of members A, B, and C may be equivalently expressed as: "a member selected from A, B, and C"; "a member selected from the group consisting of A, B, and C"; or "a member A, B, or C". The Markush group may comprise two or more of a genus, a subgenus thereof, and one or more specific members thereof; each of which may be relied upon individually or collectively and provides adequate support for specific inventive embodiments.

Any use of alternatively shall indicate an independent embodiment. The articles "a", "an", and "the" each refer to one or more. Any reference to "comparative," as in comparative example, is for illustration purposes only and shall not mean something from the prior art. Any reference to "contacting" or "combining" means bringing into physical contact. Any reference to "greater than", as in greater than a specified individual number (e.g., >50 or ≥50), encompasses a range or subrange that includes as its upper endpoint the absolute maximum (e.g., 100%) or, as the case may be where there is no absolute maximum, a practical maximum (e.g., 10,000 repeat units or 10,000,000 g/mol. Alternatively, the upper endpoint may be less than the absolute maximum (e.g., <100%) or less than the practical maximum (e.g., <10,000 repeat units or <10,000,000 g/mol). Any reference to "less than", as in less than a specified individual number (e.g., <10 or ≤10), encompasses a range or subrange that includes as its lower endpoint the absolute minimum (e.g., zero (0)) or, as the case may be where there is no absolute minimum, a practical minimum (e.g., greater than zero (>0). E.g., a practical minimum>0 is clear from the context of the expression "present at a concentration less than 10 wt %". Alternatively, the lower endpoint may be greater than the absolute minimum (e.g., >0%). Any use of "may" confers a choice, not an imperative. Any ranges relied upon herein describe and contemplate all ranges and subranges including endpoints and whole and/or fractional values therein. A disclosed endpoint or individual number between endpoints of a disclosed range or subrange may be relied upon and provides adequate support for specific inventive embodiments. Any reference to thereof shall refer to, and may be amended to be replaced by, that immediately preceding element, member, feature, limitation, list, or group to which reference is being made.

Any reference to an amount, concentration, or ratio of amounts is based on weight. Any reference to a "by-product" means a secondary product of a chemical transformation of one or more reactants. Any reference to "concentration" as a "percent" or "%" means weight percent (wt %) and is based on total weight of all ingredients used to make the material being described, which total weight is 100 wt %. Any reference to a "film" or "coating" means a material that is restricted in one dimension. The restricted dimension may be characterized as "thickness". Any reference to a material property (e.g., viscosity) or a test method for measuring same shall be that property measured at or that method conducted at 23 degrees Celsius (° C.) and 101.3 kilopascals (kPa). Any reference to a "molecular mass" of a molecule means molecular weight (MW) expressed in grams per mole and any reference to an average molecular mass of a polymer means weight average molecular weight ($M_W$) expressed in grams. $M_W$ is determined using gel permeation chromatography (GPC) with polystyrene standards. Any reference to "separation" means to cause to physically move apart, and thus as a result be no longer in direct touching. Any reference to "substrate" means a physical support having at least one surface upon which another material may be hosted. Any reference to a "vehicle" means a material acting as a carrier, hosting medium, dispersion medium, supernatant, or solvent for another material, which may or may not be soluble therein. The vehicle may be a liquid.

Any reference to a chemical element, a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/). IUPAC is the International Union of Pure and Applied Chemistry (IUPAC Secretariat, Research Triangle Park, N.C., USA). The intended meaning of any chemical term is that definition promulgated by IUPAC. Any reference to a "catalyst" means a homogeneous or heterogeneous catalyst, which may be supported or unsupported, and which may or may not be a composite catalyst. A homogeneous catalyst forms a solution with reactants and any vehicle. A heterogeneous catalyst is not soluble in the reactants and/or any vehicle present in the reaction. Any reference to "composition" means chemical matter that may be defined by an empirical formula of its constituent elements. Any organic group name ending in suffix "ene", such as hydrocarbylene, alkylene, alkenylene, alkynylene, arylene, phenylene, and the like, means a divalent radical group, which may be straight chain, branched chain, or cyclic. E.g., unsubstituted ($C_3$)hydrocarbylene includes cyclopropylene, methylethylene, and propylene, wherein cyclopropylene means cyclopropane-1,2-diyl; methylethylene means 1-methyl-ethane-1,2-diyl (i.e., propane-2,3-diyl) or 2-methyl-ethane-1,2-diyl (i.e., propane-1, 2-diyl); and propylene means propane-1,3-diyl. Any organic group containing a C—H functionality independently may be unsubstituted or substituted with one or more substituents. An organic group may be monovalent (having one free valence), divalent (having two free valences), trivalent (having three free valences), or tetravalent (having four free valences), also known as univalent, bivalent, trivalent, and quadravalent. Examples of monovalent organic groups are organyl or organoheteryl groups. Examples of organyl groups are hydrocarbyl and heterohydrocarbyl groups. Examples of organoheteryl groups are hydrocarbylamino and hydrocarbyloxy groups. Examples of divalent organic groups are organylene and organoheterylene groups. Examples of organylene groups are hydrocarbylene and heterohydrocarbylene groups. Examples of organoheterylene groups are hydrocarbyleneamino and hydrocarbyleneoxy groups. Heterohydrocarbyl, heterohydrocarbylene, organoheteryl and organoheterylene groups contain one or more heteroatoms selected from O, N, S, and P; alternatively O, N, or S; alternatively O or N; alternatively N; alternatively O.

EXAMPLES

The following examples are presented to better illustrate the method of the present invention, but are not to be considered as limiting the invention, which is delineated in the appended claims. Unless otherwise noted, all parts and percentages reported in the examples are by weight. Room or ambient temperature are 23° C. unless otherwise noted. The following table describes the abbreviations used in the examples:

TABLE 2

List of abbreviations used in the examples.

| Abbreviation | Word |
|---|---|
| g | gram |
| Me | methyl |
| wt | weight |
| % | percent |
| mol | mole |
| hr | hour |
| ° C. | degrees Celsius |
| μm | Micrometer |
| mm | millimeter |
| NA | Not Applicable |
| mL | milliliters |
| Solids Content | (wt. of dried sample/wt. of initial sample) × 100 and determined as described below |
| cm | Centimeter |
| kPa | Kilopascals |
| kPag | Pressure in kilopascals gauge |
| DIPAC | Diisopropylaminochlorosilane |
| DIPA | Diisopropylamine |
| DIPB | Diisopropyl benzene |
| TSA | Trisilylamine |
| DSA | Disilylamine |
| TCS | Trichlorosilane |
| DiPB | 1,3-diisopropylbenzene |

Gas Chromatography-Thermal Conductivity Detector (GC-TCD) instrument and conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes. GC-TDC was used to characterize the products and reactants in the following examples.

Example 1—DIPAC Synthesis

At ambient temperature and pressure, DIPA was added drop-wise from an addition funnel to a flask equipped with a condenser and containing TCS at a mole ratio of DIPA:TCS from 1:7 to 1:10 to maintain the temperature below the boiling point of TCS. The reaction temperature raised from 20° C. to 30° C. The reaction mixture was filtered using a plate filter to remove the byproduct salt. The reaction mixture was then heated to 100° C. to strip off the TCS and leave the DIPAC product.

Comparative Example 1—Synthesis of DIPAS Via Reduction of DIPAC with $LiAlH_4$

To a −20° C. chilled reactor containing a chilled mixture of DIPAC with DIPB was added a mixture of 20% $LiAlH_4$ in diethyl ether drop wise from an addition funnel, while maintaining a temperature below 10° C. The mass ratio of DIPAC to DIPB was 3:1. A 25% (w/w) excess of $LiAlH_4$ was used. Once all the $LiAlH_4$ was fed to the reactor, the reaction was maintained at −11° C. for two hours. A vacuum was then pulled to 1.3 kPa, and the temperature of the reactor pot raised to 77° C. pot raised to strip off DIPAS produced by the reaction from the pot through a condenser. A yield of 58% of DIPAS was achieved.

Comparative Example 2—Synthesis of DIPAS Via Reduction of DIPAC with LiAlH$_4$ To a −20° C. chilled reactor containing a chilled mixture of DIPAC with DIPB was added a mixture of 20% LiAlH$_4$ in diethyl ether drop wise from an addition funnel, while maintaining a temperature below 10° C. The mass ratio of DIPAC to DIPB was 5:1. A 15-20% (w/w) excess of LiAlH$_4$ was used. Once all the LiAlH$_4$ was fed to the reactor, the reaction was maintained at −0° C. for ten days. For one batch, a vacuum was then pulled to 1.3 kPa, and the temperature of the reactor pot raised to 40° C. to strip off DIPAS. For another batch, vacuum was pulled to 0.9 kPa, reflux was established, and the temperature of the reactor pot was raised to 72° C. to distill DIPAS off. The yield of the first and second batch were 62 and 63% (w/w), respectively.

Example 2—Synthesis of DIPAS Via Dehydrocoupling

A 250 mL PARR reactor was loaded with 11 g n-decane, 7.02 g DIPA, 0.4 mL of 1.0 M di-n-butylmagnesium. The reactor headspace was evacuated and repressurized to 1500 kPa with monosilane gas. The PARR reactor was then heated to and held at 80° C.+/−8° C. for 24 h then cooled to ambient temperature. After cooling the reactor, the headspace was purged and the reactants analyzed to find that 18.672 g of crude product was produced that consisted of 78.75% DiPAS, 20.41% DIPA and 0.84% of bis(diisopropylamino-silane and solvent giving a yield of DIPAS of 66.3% (w/w).

Example 3—Synthesis of DIPAS Via Dehydrocoupling

A 250 mL PARR reactor was loaded with 10.01 g DiPB, 7.01 g DIPA, 0.30 g of B(C$_6$F$_5$)$_3$. The reactor headspace was evacuated and repressurized to 655 kPa with monosilane gas. The PARR reactor was then heated to and held at 80° C.+/−8° C. for 4.5 h then cooled to ambient temperature. After cooling the reactor, the headspace was purged and the reactants analyzed to find that 16.98 g of crude product was produced that consisted of 0.96% (w/w) DiPAS, 98.53% (w/w) DIPA and 0.51% (w/w) of bis(diisopropylamino-silane and solvent. The yield of DIPAS of 0.7% (w/w), based on DIPA loading.

Example 4—TSA Synthesis Via Transamination with DIPAS

A 250 mL PARR reactor was loaded with 27.1 g of 90% (w/w) DIPAS mixed with 83.4 g of DIPB with an additional 83.0 g of additional DIPB fed into reactor to clear line of DIPAS. The reactor headspace was evacuated and repressurized to 241 kPa with anhydrous ammonia. The pressure reduced to 8 psi after 15 minutes. The PARR reactor was then heated to and held at 63° C. The headspace was purged and the reactants analyzed to find a 35% yield of TSA in DIPB.

Example 5—TSA Synthesis Via Transamination with DIPAS

A 250 mL PARR reactor chilled to −10° C. was loaded with 320 g of DIPAS. A vacuum was pulled on the reactor headspace and then the headspace was repressurized to 107 kPa with anhydrous ammonia. Ammonia feed to the reactor was continued to maintain the pressure at 107 kPa until ammonia consumption ceased. The pressure reduced to 8 psi after 15 minutes. The PARR reactor was then heated to and held at 63° C. The headspace was purged and the reactants analyzed to find a 35% yield of TSA in DIPB. The reactor pot temperature raised and level off at 13° C. The reaction mixture was analyzed by GC and 85% (w/w) of DIPAS to disilylamine (DSA) was observed. Loaded 160 g of 88% into reactor. The reactor was then heated to 40° C. for 2 h, and then 12 h at 0° C. The reaction product was then analyzed by GC and a 28% (w/w) conversion from DSA to TSA was observed.

The reaction product was then heated at 50° C. for 7 hours and the conversion from DSA to TSA increased to 56%. Next, the reactants were held at 30° C. for 16 h, then 70° C. for 2.5 hours, and the conversion from DSA to TSA increased to 87%. Next, the reactants were held at 0° C. for 48 h, then 70° C. for 2 hours, and the conversion from DSA to TSA increased to 91%. The reaction product TSA was stripped overhead at 55° C. and 32 kPa. An overall TSA yield of 80% achieved: 223 g of 42% pure TSA (46% DIPA). Finally, the reaction product was was distilled to 94% (w/w) TSA purity.

That which is claimed is:

1. A method of making an organoaminosilane compound, the method comprising:
    combining
    A) a compound comprising a primary or secondary amine,
    B) monosilane (SiH$_4$), and
    C) a catalyst, where the catalyst comprises magnesium or boron, wherein the catalyst comprising magnesium has the formula (R$^5{}_2$N)$_2$Mg, wherein each R$^5$ independently is a hydrocarbyl group having from 1 to 20 carbon atom, and wherein the catalyst comprising boron has the formula BR$^4{}_3$, where each R$^4$ independently is a C$_{1-10}$ substituted or unsubstituted hydrocarbyl,
    where A), B) and C) are combined under sufficient conditions to form the organoaminosilane compound and hydrogen.

2. A method as in claim 1, where the organoaminosilane is according to formula (I)

$$R^1N(R^2)_a(H)_c(SiH_3)_{2-a-c} \tag{I}$$

where R$^1$ is an organic polymer, C$_{1-20}$ hydrocarbyl, or —SiR$^3{}_3$, where R$^3$ is C$_{1-6}$ hydrocarbyl, R$^2$ is C$_{1-20}$ hydrocarbyl, H, —SiH$_3$, or SiR$^3{}_3$, where R$^3$ is as defined above, subscript a is 0 or 1, c is 0 or 1, and a+c<2, provided that the organoaminosilane produced in i) has at least one more nitrogen-bonded —SiH$_3$ groups than the compound comprising the primary or secondary amine.

3. A method as in claim 1, wherein the compound comprising a primary or secondary amine is according to formula (III)

$$R^1N(R^2)_aH_{2-a} \tag{III}$$

where R$^1$ is an organic polymer, C$_{1-20}$ hydrocarbyl, or —SiR$^3{}_3$, where R$^3$ is C$_{1-6}$ hydrocarbyl, R$^2$ is C$_{1-20}$ hydrocarbyl, H, —SiH$_3$, or SiR$^3{}_3$, where R$^3$ is as defined above, and subscript a is 0 or 1.

4. A method as in claim 3 wherein the compound comprising a primary or secondary amine according to formula (III) is an organic polymer comprising one or more groups according to formula (II)

$$-N(R^2)_a(H)_b(SiH_3)_{2-a-b} \tag{II}$$

where $R^2$ is $C_{1-20}$ hydrocarbyl, H, —$SiH_3$, or —$SiR^3{}_3$, where $R^3$ is $C_{1-6}$ hydrocarbyl, subscript a is 0 or 1, subscript b is 1 or 2, a+b<3, and where the groups according to formula (II) are in pendant, terminal, or pendant and terminal positions on the organic polymer, and the organoaminosilane compound is an organic polymer comprising one or more groups according to formula (IV)

$$-N(R^2)_a(H)_c(SiH_3)_{2-a-c} \qquad (IV)$$

where each $R^2$ and each subscript a are independently as defined above, subscript c is 0 or 1, a+c is 0 or 1, and the groups according to formula (IV) are in pendant, terminal, or pendant and terminal positions on the organic polymer.

5. A method as in claim 2, wherein each $R^1$ independently is a branched alkyl having 3 to 6 carbon atoms, and each $R^2=R^1$.

6. A method as in claim 1 wherein the conditions are a temperature from −20° C. to 150° C. and a pressure above 102 kPa.

7. A method of making a silylamine, the method comprising:
i) combining
   A) a compound comprising a primary or secondary amine,
   B) monosilane ($SiH_4$), and
   C) a catalyst, where the catalyst comprises magnesium or boron,
where A), B) and C) are combined under sufficient conditions to form an organoaminosilane compound and hydrogen, and
ii) combining ammonia and the organoaminosilane compound produced in i) under sufficient conditions to form a silylamine product and a byproduct, where the byproduct is a primary or secondary amine.

8. A method of making a silylamine as in claim 7, wherein the organoaminosilane is according to formula (I)

$$R^1N(R^2)_a(SiH_3)_{2-a} \qquad (I),$$

where $R^1$ is an organic polymer, a $C_{1-20}$ hydrocarbyl group or —$SiR^3{}_3$, where each $R^3$ independently is $C_{1-6}$ hydrocarbyl, each $R^2$ independently is a $C_{1-20}$ hydrocarbyl group, H, or —$SiR^3{}_3{}^1$, where each $R^3$ independently is as defined above, subscript a is 0 or 1, and $R^1$ and $R^2$ may be the same or different.

9. A method as in claim 7, wherein the silylamine product is trisilylamine, $N(SiH_3)_3$.

10. A method as in claim 7, wherein the sufficient conditions to form a silylamine product are a temperature from −20° C. to 150° C. and a pressure greater than 102 kPa.

11. A method as in claim 10, wherein the temperature is from 0° C. to 75° C.

12. A method as in claim 7, wherein $R^1$ is alkyl and each $R^2$ is independently $R^1$ or H.

13. A method as in claim 12, wherein $R^1$ is branched alkyl having 3 to 6 carbon atoms, and each $R^2$ is independently $R^1$ or H.

14. A method as in claim 8, wherein the compound according to formula (I) is an organic polymer comprising one or more groups according to formula (II)

$$-N(R^2)_a(H)_b(SiH_3)_{2-a-b} \qquad (II)$$

where each $R^2$ independently is H, $C_{1-20}$ hydrocarbyl, or —$Si(R^3)_3$, where each $R^3$ independently is $C_{1-6}$ hydrocarbyl, subscript a and b independently are 0 or 1, and a+b<2, where the groups according to formula (II) are in pendant, terminal, or pendant and terminal positions on the organic polymer.

15. A method according to claim 7, wherein a solvent is combined with the ammonia and the organoaminosilane compound.

16. A method as in claim 7, further comprising iii) combining the byproduct formed in ii) in i), wherein the byproduct formed in ii) is combined in i) as A) the compound comprising a primary or secondary amine.

17. A method as in claim 7, wherein the catalyst comprising magnesium has the formula $(R^5{}_2N)_2Mg$, wherein each $R^5$ independently is a hydrocarbyl group having from 1 to 20 carbon atom, and wherein the catalyst comprising boron has the formula $BR^4{}_3$, wherein each $R^4$ independently is a $C_{1-10}$ substituted or unsubstituted hydrocarbyl.

18. A method as in claim 1, wherein the catalyst comprising magnesium is selected from the group consisting of bis(dimethylamino) magnesium, bis(diethylamino) magnesium, bis(diisopropylamino) magnesium, bis(dipropylamino) magnesium, bis(di-1-methylpropylamino) magnesium, bis(dipentylamino) magnesium, bis(di-1-methylbutylamino) magnesium, bis(dihexylamino) magnesium, bis(dicyclohexylamino) magnesium, bis(diheptylamino) magnesium, dioctylamino) magnesium, bis(dinonylamino) magnesium, bis(didecylamino) magnesium, bis(diundecylamino) magnesium, bis(dodecylamino) magnesium, bis(dipentadecylamino) magnesium, bis(dioctadecylamino) magnesium, and bis(dicosylamino) magnesium.

19. A method as in claim 1, wherein the catalyst comprising boron is selected from the group consisting of trimethylborane, triethylborane, triphenylborane and tris(pentafluorophenyl)borane.

20. A method as in claim 19, wherein the catalyst is boron tris-pentafluorobenzene.

* * * * *